United States Patent

Harada

(10) Patent No.: US 6,711,229 B1
(45) Date of Patent: Mar. 23, 2004

(54) METHOD OF SYNCHRONIZING PHASE-LOCKED LOOP, PHASE-LOCKED LOOP AND SEMICONDUCTOR PROVIDED WITH SAME

(75) Inventor: Hirotaka Harada, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 645 days.

(21) Appl. No.: 09/722,014

(22) Filed: Nov. 27, 2000

(30) Foreign Application Priority Data

Dec. 1, 1999 (JP) .......................................... 11-342525

(51) Int. Cl.[7] .............................................. H03D 3/24
(52) U.S. Cl. ...................................... 375/376; 332/128
(58) Field of Search .......................... 375/376; 327/146, 327/147, 148, 157; 331/1 A, 17, 25, 23, 34, 1 R; 332/128

(56) References Cited

U.S. PATENT DOCUMENTS 4,745,372 A * 5/1988 Miwa ............................ 331/8
5,983,077 A * 11/1999 Dent ............................ 455/44

FOREIGN PATENT DOCUMENTS

| JP | A 3-205920 | 9/1991 |
| JP | A 4-207322 | 7/1992 |
| JP | 7-240041 | 9/1995 |
| JP | A 9-93125 | 4/1997 |
| JP | 2933134 | 9/1998 |
| JP | 10-269503 | 10/1998 |
| JP | 11-16311 | 1/1999 |
| JP | 2000-163896 | 6/2000 |
| JP | 2000-260140 | 9/2000 |
| JP | A 2001-16103 | 1/2001 |
| WO | WO 93/02451 | 4/1993 |

* cited by examiner

Primary Examiner—Don N. Vo
(74) Attorney, Agent, or Firm—Young & Thompson

(57) ABSTRACT

There is provided a method of synchronizing a phase-locked loop (PLL) which is capable of reducing an area occupied by the PLL in a chip of the semiconductor device and shortening a lock-up time even when a band of an oscillation frequency is wide and a changeable range of a multiplying factor is wide. The method for synchronizing the PLL includes a step of smoothing, by using a low pass filter (LPF), a control current flowing in or out from a charge pump in accordance with an up-clock/UCK or a down-clock DCK to be fed from a phase frequency comparator to output it as a control voltage, a step of oscillating an internal clock, by using a voltage controlled oscillator (VCO), having number of oscillation frequencies corresponding to a control voltage in an oscillation frequency band decided in accordance with oscillation frequency band setting data, a step of dividing, using a frequency divider, a frequency of the internal clock at a rate of frequency division decided in accordance with multiplying factor setting data to output it as a frequency-divided clock and a step of changing a value of the control current in accordance with oscillation frequency band setting data and with multiplying factor setting data.

16 Claims, 11 Drawing Sheets

FIG.2

| oscillation frequency bands | multiplying factor | | | | |
|---|---|---|---|---|---|
| | 2~5 | 6~16 | 17~45 | 46~128 | |
| 50~80MHz | $S_2$ | $S_3$ | $S_4$ | $S_4$ | |
| 80~125MHz | $S_1$ | $S_2$ | $S_3$ | $S_4$ | |
| 125~200MHz | $S_1$ | $S_2$ | $S_3$ | $S_4$ | |
| 200~300MHz | $S_1$ | $S_2$ | $S_2$ | $S_3$ | |

METHOD OF SYNCHRONIZING PHASE-LOCKED LOOP, PHASE-LOCKED LOOP AND SEMICONDUCTOR PROVIDED WITH SAME

BACKGROUND OF THE INVENTION

1. Field of the Invention

The present invention relates to a method for synchronizing a phase-locked loop (PLL), a PLL and a semiconductor device provided with the PLL and more particularly to the method for synchronizing the PLL by which an internal clock is synchronized with a reference clock fed from an inside and/or outside of a semiconductor device, the PLL and the semiconductor device provided with the same.

The present application claims priority of Japanese Patent Application No. Hei11-342525 filed on Dec. 1, 1999, which is hereby incorporated by reference.

2. Description of the Related Art

Generally, as one of methods for operating, with high stability and efficiency, a large-scale and complicated digital circuit, a synchronous-type circuit design method by which all latches in a digital circuit are operated in synchronization with one clock is available. When a semiconductor device such as an LSI (Large Scale Integrated Circuit), VSLI (Very Large Scale Integrated Circuit), ULSI (Ultra Large Scale Integrated Circuit) or a like is manufactured, the above synchronous-type circuit design method is mainstream. To properly operate the digital circuit designed in accordance with such a synchronous-type circuit design, it is necessary to make all latches work with a same timing. A reason is that a deviation in timing among clocks causes inconveniences as described below. That is, for example, when a shift register is constructed of a plurality of latches connected in series, if a rise or a fall of a clock to be fed to a latch in a back stage is slightly delayed behind a rise or a fall of a clock to be fed to a latch in a front stage, since output data from the latch in the front stage changes an instant at which the latch in the back stage tries to capture output data from the latch in the front stage, there is a danger that such an erroneous operation as immediate outputting of data that should have been delayed originally, by one clock period of the clock, from the latch in the back stage occurs. This phenomenon is generally called "racing". Moreover, in a synchronous-type semiconductor device, data is read in accordance with a data reading command fed from a CPU (Central Processing Unit) and in synchronization with an internal clock generated in synchronization with an external clock fed from outside and, therefore, if there is a deviation in the synchronization, the CPU cannot read data correctly, thus causing a malfunction of the CPU and, in turn, of an entire system.

As the semiconductor device including an LSI, VLSI, ULSI or the like becomes highly integrated and high-speed in recent years in particular, since number of latches making up the semiconductor device increases, when digital circuits are mounted on a chip of the semiconductor device, number of latches operating simultaneously increases, causing an increasing risk of occurrence of errors in reading data or of racing described above. To solve this problem, the semiconductor device provided with a PLL by which clocks to be fed to all latches are synchronized with a reference clock fed from a clock generating unit mounted outside or inside the semiconductor device, is manufactured.

Moreover, in order to respond to high-speed operations of such semiconductor devices including the LSI, VLSI, ULSI or the like in recent years, it is required that the semiconductor device should operate on the clock having a high frequency. However, if a frequency itself of the reference clock to be fed from the outside of the semiconductor device is boosted, current consumption rapidly increases. To solve this problem, a method is ordinarily employed in which a clock synchronizing to the reference clock fed from the outside of the semiconductor device having a multiplied frequency is generated by the PLL mounted inside the semiconductor device, without boosting the frequency of the reference clock.

Furthermore, since the semiconductor device including an LSI, VLSI, ULSI or the like composed of a million or more transistors has been realized, it is impossible to perform circuit design directly at a transistor level. Therefore, it is necessary to sequentially and in stages perform system design which decides operations and configurations of an entire system so that each of a CPU, ROM (Read Only Memory), RAM (Random Access Memory) or a like operates as one functional block to provide desired functions of the entire system, logical design which decides relationships among functional blocks and operations in the functional blocks in accordance with specifications decided by the system design, detailed logical design which decides combinations of logical elements including NAND gates, NOR gates, latches, counters or a like to construct each of the functional blocks and circuit design which decides characteristics of electronic circuits and devices at the transistor level to meet the circuit specifications based on the logical design. At the stage of the above logical design, the PLL is treated as one of circuit blocks constituting the functional blocks and a logical designer performs the logical design freely without taking each of characteristics of the circuit block into consideration. As described above, since the PLL is treated as one of circuit blocks and its general versatility is required, a band of an oscillation frequency of a clock must be wide and a changeable range of a multiplying factor expressing the multiplying factor of an oscillation frequency of the clock to an oscillation frequency of a reference clock must also be wide.

FIG. 10 is a schematic block diagram showing an example of configurations of a conventional PLL having a wide band of an oscillation frequency and a wide changeable range of a multiplying factor. As shown in FIG. 10, the conventional PLL is composed of a phase frequency comparator 1, a charge pump 2, a low pass filter LPF 3, a voltage controlled oscillator (VCO) 4 and a frequency divider 5. The PLL is to be mounted on a chip of a semiconductor device. The phase frequency comparator 1 detects a difference in a phase frequency between a reference clock $CK_R$ to be fed from the outside and inside of the semiconductor device and a frequency-divided clock $CK_D$ to be fed from the frequency divider 5 and feeds an up-clock/UCK (active-low) or a down-clock DCK (active-high) having a pulse width corresponding to a difference in the phase frequency to the charge pump 2. The charge pump 2 permits a control current $I_C$ to flow out on the up-clock/UCK having a pulse width corresponding to a difference in phase frequency fed from the phase frequency comparator 1 to put charge into a capacitor constituting the LPF 3 and also permits the control current $I_C$ to flow in on the down-clock DCK having a pulse width corresponding to the difference in the phase frequency fed from the phase frequency comparator 1 to put accumulated charge out of the capacitor constituting the LPF 3.

The LPF 3, as shown in FIG. 11, is a secondary loop filter composed of a resistor 6 having a resistance R and a capacitor 7 having a capacitance $C_1$ both of which are connected in series to each other and a capacitor 8 having a capacitance $C_2$ which is connected in parallel to the resistor 6 and the capacitor 7. The LPF 3 is connected between an output terminal of the charge pump 2 and a ground, and is adapted to smooth the control current $I_C$ and outputs it as a control voltage. The VCO 4, when receiving 2-bit oscillation frequency band setting data $DT_F$, oscillates an internal clock $CK_I$ having an oscillation frequency corresponding to the control voltage fed from the LPF 3 in a frequency band selected out of frequency bands which have been set, for example, in four stages and feeds it to the frequency divider 5. The frequency divider 5, in accordance with a multiplying factor N set based on, for example, 7-bit multiplying factor setting data $DT_D$ fed from a CPU (not shown), divides a frequency of the internal clock $CK_I$ and feeds the frequency-divided clock $CK_D$ to the phase frequency comparator 1. In the above PLL, when an oscillation frequency of the reference clock $CK_R$ is defined to be "f", since an oscillation frequency of the internal clock $CK_I$ becomes (N×f), the "N" represents a multiplying factor. Also, at this point, since the frequency divider 5 divides the frequency of the internal clock $CK_I$ into frequency-divided clock $CK_D$ having an oscillation frequency being same as that of the reference clock $CK_R$, the "N" is also a frequency dividing ratio.

An open loop gain G(s) of the conventional PLL is given by $$G(s) = \frac{I_C}{2\pi} \times F(s) \times \frac{K_V}{s} \times \frac{1}{N} \quad (1)$$

the following equation (1):
where "s" represents a complex variable, "$I_C$" represents control current of the charge pump 2, "F(s)" represents a transfer function of the PLL, "$K_V$" represents a modulation sensitivity of the VCO 4 and "N" is a multiplying factor. If the oscillation frequency band is, for example, between 50 MHz and 300 MHz and the multiplying factor N is, for example, 2 to 128, the modulation sensitivity $K_V$ of the VCO 4 to a control voltage of 1V supplied from the LPF 3 becomes 67.3 MHz to 401 MHz due to effects of variations in manufacturing processes and in voltages. Therefore, as is apparent from the equation (1), the open loop gain G(s) of the PLL changes about 381-fold (=(401/2)/(67.3/128)). According to an automatic control theory, a phase margin which represents how much margin a phase∠G(s) has against a phase lag (–180° ) being an oscillating condition when the open loop gain G(s) of the PLL is 0 (zero) dB, is preferably 45° or more.

FIG. 12 is a Bode diagram explaining inconvenient points of the conventional PLL, in which (1) shows a gain diagram and (2) shows a phase diagram. If the open loop gain G(s) of the PLL is changed as much as about 381-fold, as shown by an arrow in (1) of FIG. 12 in the Bode diagram, since the gain diagram moves to upper and lower positions parallel to itself, an angular frequency ω obtained when the gain is 0 dB changes. However, the phase diagram does not change as shown in (2) of FIG. 12. Therefore, there is a danger that the phase margin obtained when the gain diagram goes down most, that is, at a point "a" in (1) of FIG. 12 and when the gain diagram goes up most, that is, at a point "b" in (2) of FIG. 12 is smaller than 45° (see a small arrow shown in (2) of FIG. 12) and, if so, since a damping factor becomes small, ringing is apt to occur as shown by a curve "a" in FIG. 13. Because of this, the oscillation frequency of the VCO 4 changes greatly during a process (that is, during a lock-up process) from a supply of the reference clock $CK_R$ to the PLL to a synchronization of the frequency-divided clock $CK_D$ to the reference clock $CK_R$, thus causing a delayed convergence toward a predetermined oscillation frequency. Time required between supply of the reference clock $CK_R$ to the PLL and convergence of the oscillation frequency of the VCO 4 to a predetermined oscillation frequency is called "lock-up time". Moreover, the curve "b" shown in FIG. 13 shows a convergence process of an oscillation frequency of the VCO 4 in a lock-up process when there is enough phase margin. There is a case where an oscillation frequency of the reference clock $CK_R$ changes due to some external factors, thereby causing the oscillation frequency to be restored to its original frequency and, in this case, the PLL exhibits a same behavior as observed in the above lock-up process. This causes the above phase margin to be made smaller and, in the case of a PLL having a small damping factor, the ringing occurs readily and a jitter increases.

To solve this problem, conventionally, in order to obtain enough phase margin when the gain diagram goes down most, capacitance $C_1$ of the capacitor 7 constituting the LPF 3 is made large and capacitance $C_2$ of the capacitor 8 is made much smaller than the capacitance $C_1$ of the capacitor 7. For example, when the resistance R of the resistor 6 is 33 k$\Omega$, the capacitance $C_1$ of the capacitor 7 is adjusted to be 240 pF and the capacitor $C_2$ of the capacitor 8 is adjusted to be 8 pF (one-thirtieth of the capacitance $C_1$). However, if a semiconductor device containing the PLL with such the LPF configurations as described above is constructed, an area occupied by the LPF 3 in a chip of the semiconductor device is, for example, 245 μm×245 μm, which means that the PLL constitutes 33.5% of a total area of the chip. To solve this problem, technology for switching a capacitor constituting an LPF depending on an oscillation frequency of a VCO is disclosed, for example, in Japanese Patent Application Laid-open No. Hei 10-233682 (Japanese Patent No. 2933134). However, this technology has a problem in that a plurality of capacitors must be pre-mounted, causing an increase in the area occupied by the LPF in the chip.

SUMMARY OF THE INVENTION

In view of the above, it is an object of the present invention to provide a method of synchronizing a PLL, a PLL and a semiconductor device provided with the PLL capable of reducing an area occupied by the PLL in a chip of a semiconductor device and shortening a lock-up time even when a band of an oscillation frequency is wide and a changeable range of a multiplying factor is wide.

According to a first aspect of the present invention, there is provided a method of synchronizing a PLL composed of, at least, a phase frequency comparator to output an up-clock or a down-clock having a pulse width or a number of pulses corresponding to a difference in an oscillation frequency between a reference clock and a frequency-divided clock, a charge pump to cause a control current to flow in or out in accordance with the up-clock or the down-clock, an LPF to smooth the control current and to output it as a control voltage, a VCO to oscillate an internal clock having an oscillation frequency corresponding to the control voltage in accordance with set modulation sensitivity and a frequency divider to divide a frequency of the internal clock in accordance with a set multiplying factor and to output it as the frequency-divided clock, the method including a step of changing a value of the control current in accordance with the set modulation sensitivity and with the set multiplying factor.

According to a second aspect of the present invention, there is provided a method of synchronizing a PLL composed of, at least, a phase frequency comparator to output an up-clock or a down-clock having a pulse width or a number of pulses corresponding to a difference in an oscillation frequency between a reference clock and a frequency-divided clock, a charge pump to cause a control current to flow in or out in accordance with the up-clock or the down-clock, an LPF to smooth the control current and to output it as a control voltage, a VCO to oscillate an internal clock having an oscillation frequency corresponding to the control voltage in one oscillation frequency band selected out of a plurality of oscillation frequency bands and a frequency divider to divide a frequency of the internal clock in accordance with a set multiplying factor and to output it as the frequency-divided clock, the method including a step of changing a value of the control current in accordance with the one oscillation frequency band selected out and with the set multiplying factor.

In the foregoing, a preferable mode is one wherein a value of the control current is changed in a manner so as to cause an open loop gain in the PLL to fall within a predetermined range.

According to a third aspect of the present invention, there is provided a PLL including:

a phase frequency comparator to output an up-clock or a down-clock having a pulse width or a number of pulses corresponding to a difference in an oscillation frequency between a reference clock and a frequency-divided clock;

a charge pump to cause a control current to flow in or out in accordance with the up-clock or the down-clock;

an LPF to smooth the control current and to output it as a control voltage, a VCO to oscillate an internal clock having an oscillation frequency corresponding to the control voltage in accordance with set modulation sensitivity;

a frequency divider to divide a frequency of the internal clock in accordance with a set multiplying factor and to output it as the frequency-divided clock; and a control current changing circuit for changing a value of the control current in accordance with the set modulation sensitivity and with the set multiplying factor.

According to a fourth aspect of the present invention, there is provided a PLL including;

a phase frequency comparator to output an up-clock or down-clock having a pulse width or a number of pulses corresponding to a difference in an oscillation frequency between a reference clock and a frequency-divided clock;

a charge pump to cause a control current to flow in or out in accordance with the up-clock or the down-clock;

an LPF to smooth the control current and to output it as a control voltage, a VCO to oscillate an internal clock having an oscillation frequency corresponding to the control voltage in accordance with set modulation sensitivity;

a frequency divider to divide a frequency of the internal clock in accordance with a set multiplying factor and to output it as the frequency-divided clock; and a control current changing circuit for changing a value of the control current in accordance with the set modulation sensitivity and with the set multiplying factor.

In the foregoing, a preferable mode is one wherein the control current changing circuit changes a value of the control current in a manner so as to cause an open loop gain in the PLL to fall within a predetermined range.

Also, a preferable mode is one wherein the charge pump is provided with a plurality of constant current sources to provide constant currents each having a different current value and causes a constant current from a constant current source selected in response to a signal to be fed from the control current changing circuit to flow in or out as the control current.

Also, a preferable mode is one wherein, in the charge pump, a switching circuit for switching between a function of permitting the control current to flow out in accordance with the up-clock and a function of permitting the control current to flow in, in accordance with the down-clock and a receiving/releasing circuit for receiving or releasing the control current are mounted in a separated state.

Furthermore, a preferable mode is one wherein the charge pump is so configured that the plurality of constant current sources are divided into a plurality of blocks each having constant current sources whose constant currents are similar and near to each other and that each block is provided with a selecting circuit for selecting any one of the constant current sources in accordance with a signal to be fed from the control current changing circuit, with the switching circuit for switching between flow-in and flow-out of the control currents and with the receiving/releasing circuit for receiving or releasing control currents.

According to a fifth aspect of the present invention, there is provided a semiconductor device being provided with the above described PLL.

BRIEF DESCRIPTION OF THE DRAWINGS

The above and other objects, advantages and features of the present invention will be more apparent from the following description taken in conjunction with the accompanying drawings in which:

FIG. 2 is a diagram showing relationships among each of oscillation frequency band ranges, each of multiplying factor ranges and each of control current setting signals $S_1$ to $S_4$;

DETAILED DESCRIPTION OF THE PREFERRED EMBODIMENTS

Best modes of carrying out the present invention will be described in further detail using various embodiments with reference to the accompanying drawings.

First Embodiment

Figure 1:
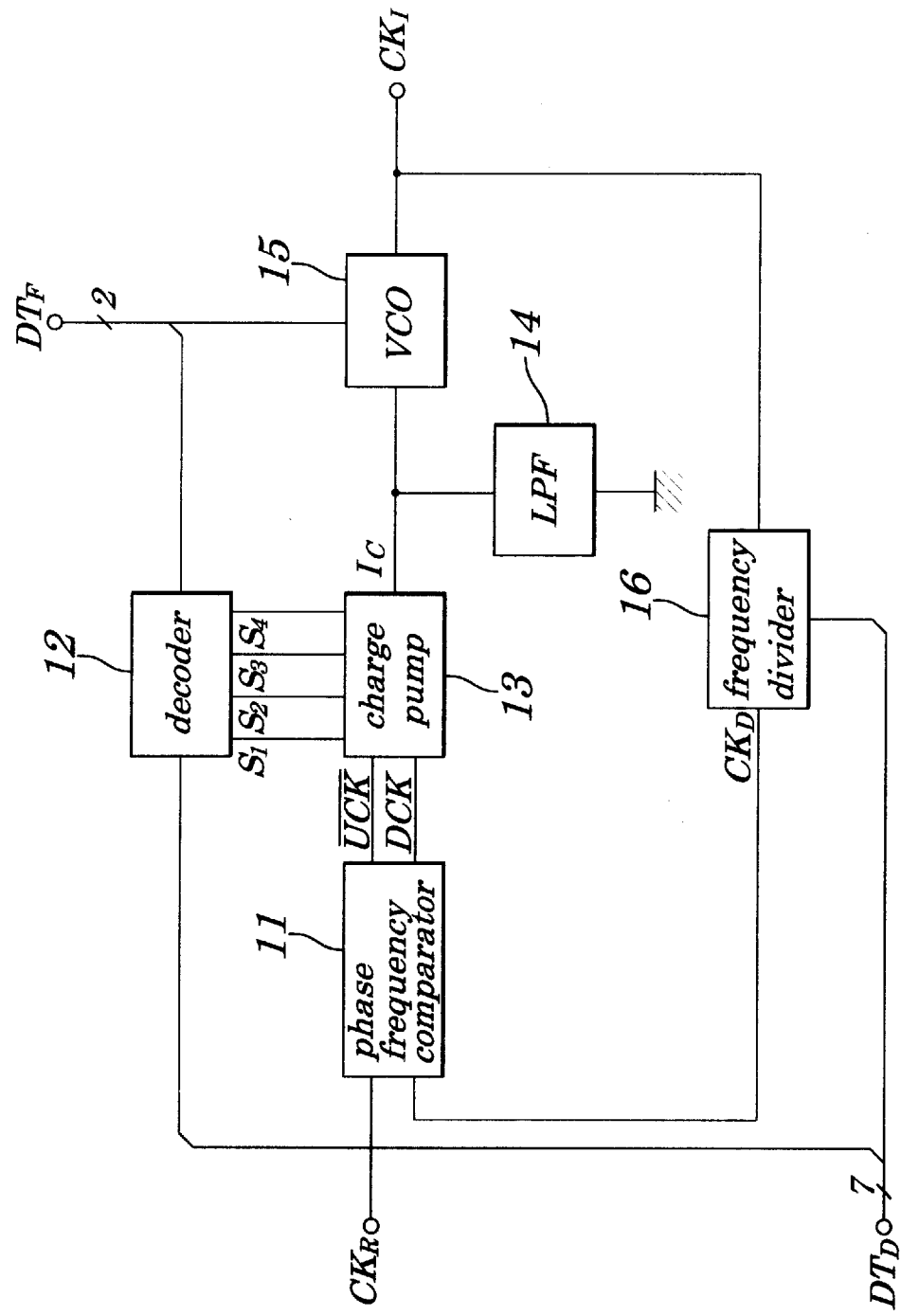
FIG. 1 is a schematic block diagram showing configurations of a PLL according to a first embodiment of the present invention.

FIG. 1 is a schematic block diagram showing configurations of a PLL according to a first embodiment of the present invention. The PLL of the first embodiment is composed of a phase frequency comparator 11, a decoder 12, a charge pump 13, an LPF 14, a VCO 15 and a frequency divider 16 and is formed as one circuit block on a chip of a semiconductor device. In the PLL of the first embodiment, a band of an oscillation frequency of an internal clock $CK_I$ is set between 50 MHz to 300 MHz and the band is divided into four ranges including a first range of 50 MHz to 80 MHz, a second range of 80 MHz to 125 MHz, a third range of 125 MHz to 200 MHz and a fourth range of 200 MHz to 300 MHz. A multiplying factor N of a maximum frequency to a minimum frequency in each of the four band ranges is set to 1.5 to 1.6. The multiplying factor N is set between 2 and 128 and is also divided into four ranges including a first range of 2 to 5, a second range of 6 to 16, a third range of 17 to 45 and a fourth range of 46 to 128. The multiplying factor N of a maximum multiplying factor N to a minimum multiplying factor N is 2.5 to 3 in each of the four multiplying factor ranges. The above setting for both the oscillation frequency band and the multiplying factor N is performed for convenience in manufacturing of semiconductor devices.

The phase frequency comparator 11 detects a difference in a phase frequency between a reference clock $CK_R$ fed from an inside or outside of a semiconductor device and frequency-divided clock $CK_D$ fed from the frequency divider 16 and feeds an up-clock/UCK (active-high) or down-clock DCK (active-low) having a pulse width corresponding to a difference in the phase frequency, to the charge pump 13.

Figure 3:
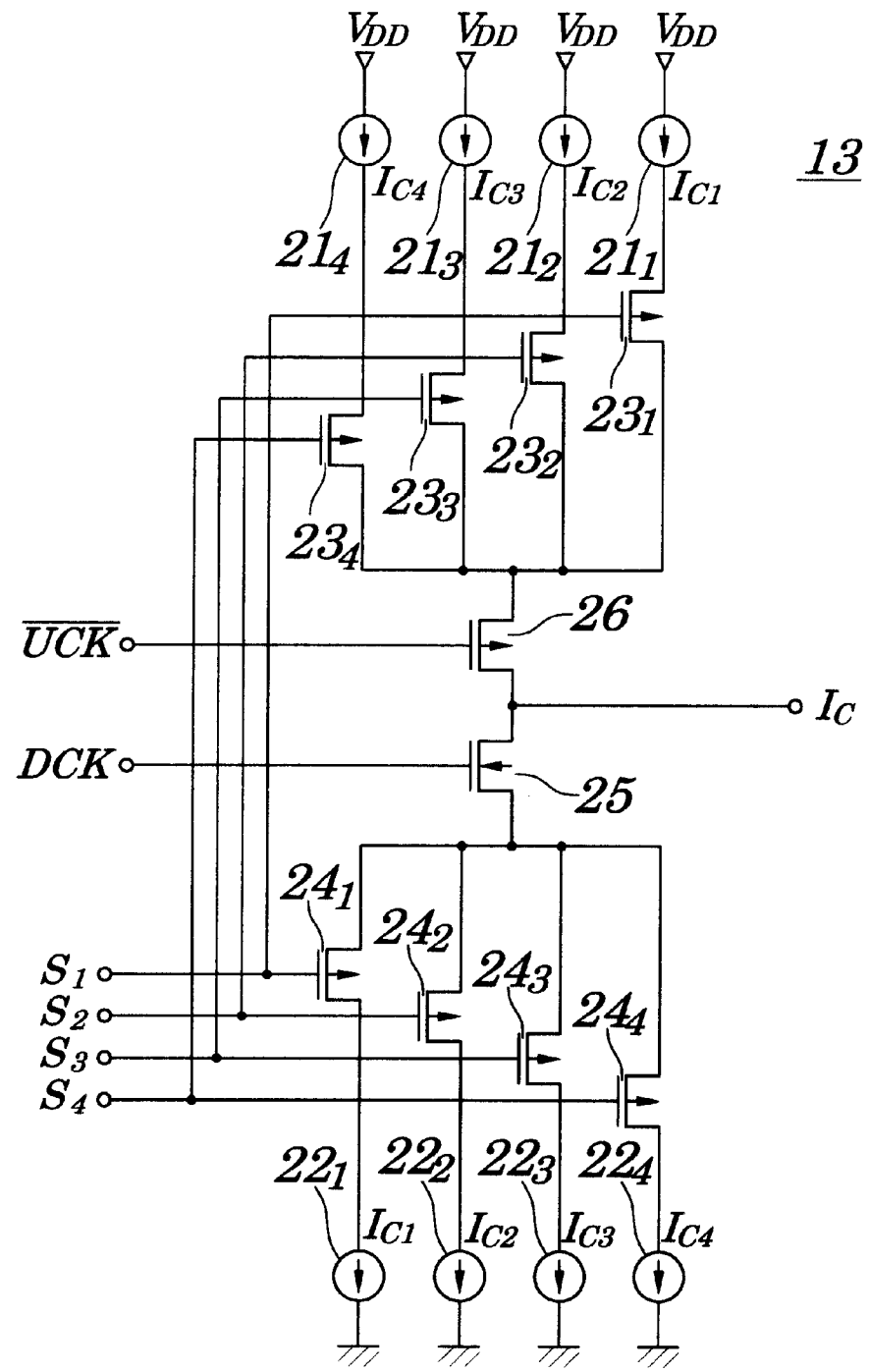
FIG. 3 is a schematic circuit diagram showing one example of configurations of a charge pump constituting the PLL according to the first embodiment of the present invention.

The decoder 12 generates any one of control current setting signals $S_1$ to $S_4$ for setting any one of constant currents $I_{C1}$ to $I_{C4}$ as a control current $I_C$ of the charge pump 13, as shown in FIG. 3, based on 2-bit oscillation frequency band setting data $DT_F$, fed from a CPU (not shown), for setting any one of band ranges including the first range to fourth range and based on 7-bit multiplying factor setting data $DT_D$, fed from the CPU, for setting any one of the multiplying factors N including 2 to 128. Relationships among each of oscillation frequency band ranges, each of multiplying factor ranges and each of control current setting signals $S_1$ to $S_4$ are shown in FIG. 2.

The charge pump 13 is controlled by any one of constant currents $I_{C1}$ to $I_{C4}$ which have been set in accordance with the control current setting signals $S_1$ to $S_4$ fed from the decoder 12 and puts charge in a capacitor constituting the LPF 14 by permitting the set control current $I_C$ to flow out, in accordance with the up-clock/UCK having a pulse width corresponding to a difference in a phase frequency fed from the phase frequency comparator 11 and puts charge out of the capacitor constituting the LPF 14 by permitting the set constant current $I_C$ to flow in, in accordance with the down-clock DCK having a pulse width corresponding to a difference in the phase frequency fed from the phase frequency comparator 11.

FIG. 3 is a schematic circuit diagram showing one example of configurations of the charge pump 13 constituting the PLL according to the first embodiment. The charge pump 13 is composed of constant current sources $21_1$ to $21_4$ and $22_1$ to $22_4$, n-channel MOS transistors $23_1$ to $23_4$, $24_1$ to $24_4$ and 25, and a p-channel MOS transistor 26. The constant current sources $21_1$ and $22_1$ are adapted to supply constant currents $I_{C1}$ of, for example, 0.78 μA to corresponding n-channel MOS transistors $23_1$ and $24_1$ respectively. The constant current sources $21_2$ and $22_2$ are adapted to supply constant current $I_{C2}$ of, for example, 2.3 μA to corresponding n-channel MOS transistors $23_2$ and $24_2$ respectively. The constant current sources $21_3$ and $22_3$ also supply constant current $I_{C3}$ of, for example, 7.0 μA to corresponding n-channel MOS transistors $23_3$ and $24_3$ respectively. The constant current sources $21_4$ and $22_4$ are adapted to supply constant current $I_{C4}$ of, for example, 16.3 μA to corresponding n-channel MOS transistors $23_4$ and $24_4$ respectively. Each of the n-channel MOS transistors $23_1$ to $23_4$ is turned ON by a supply of each of corresponding active-high control current setting signals $S_1$ to $S_4$ and permits each of the constant currents $I_{C1}$ to $I_{C4}$ to be fed from each of the corresponding constant current sources $21_1$ to $21_4$ to flow out as the control current $I_C$ through the p-channel MOS transistor 26 which has been turned ON on an active-low up-clock/UCK. Each of the n-channel MOS transistors $24_1$ to $24_4$ is turned ON by a supply of each of corresponding active-high control current setting signals $S_1$ to $S_4$ and permits each of the constant currents $I_{C1}$ to $I_{C4}$ to flow in as the control current $I_C$ through the n-channel MOS transistor 25 which has been turned ON on an active-high down-clock DCK.

Figure 11:
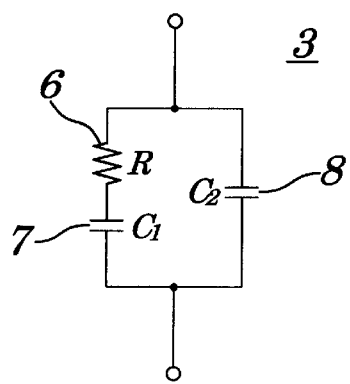
FIG. 11 is a schematic block diagram showing an example of configurations of an LPF constituting the conventional PLL of FIG. 10.

The LPF 14 shown in FIG. 1 is, as in the case of the conventional LPF shown in FIG. 11, a secondary loop filter composed of a resistor 6 having a resistance R and a capacitor 7 having a capacitance $C_1$ both of which are connected in series to each other and a capacitor 8 having a capacitance $C_2$ which is connected in parallel to the resistor 6 and the capacitor 7. The LPF 14 is connected between an output terminal of the charge pump 13 and a ground, and is adapted to smooth the control current $I_C$ and to output it as a control voltage. However, in the first embodiment, the resistance R of the resistor 6 is 33 kΩ, the capacitance $C_1$ of the capacitor 7 is adjusted to be 80 pF and the capacitor $C_2$ of the capacitor 8 is adjusted to be 8 pF (one-tenth of the capacitance $C_1$). Therefore, an area occupied by the LPF 14 in a chip of a semiconductor device is, for example, 152 μm×152 μm, which means that the LPF 14 constitutes 15.9% of a total area of the chip. The VCO 15, in an oscillation frequency band in a range set based on the 2-bit oscillation frequency band setting data $DT_F$ fed from the CPU (not shown), oscillates the internal clock $CK_I$ having the oscillation frequency corresponding the control voltage supplied from the LPF 14 and supplies it to the frequency divider 16. The frequency divider 16, in accordance with the multiplying factor N set based on the 7-bit multiplying setting data $DT_D$ fed from the CPU (not shown), divides the frequency of the internal clock $CK_I$ and feeds the frequency-divided clock to the phase frequency comparator 11.

Next, reasons why the PLL of the first embodiment is constructed in a manner as described above is explained.

Figure 12:
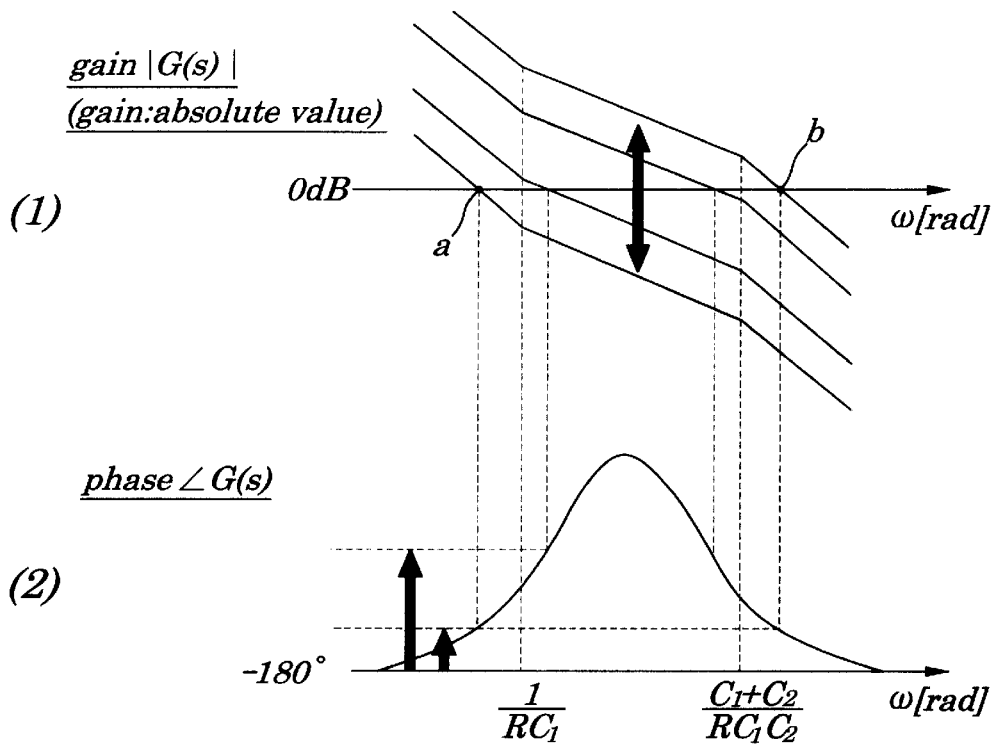
FIG. 12 is a Bode diagram explaining inconvenient points of the conventional PLL, in which (1) shows a gain diagram and (2) shows a phase diagram.
Figure 13:
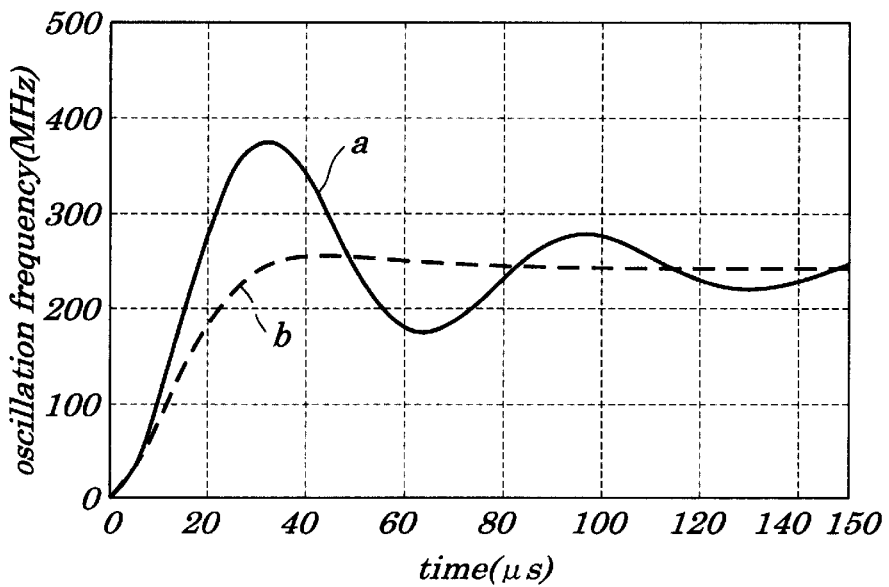
FIG. 13 is a waveform showing one example of temporal changes in an oscillation frequency of a VCO in a lock-up process of the conventional PLL.

First, since an open loop gain G(s) of the PLL of the first embodiment can be expressed by the equation (1) described above, if the oscillation frequency band is between 50 MHz and 300 MHz and if the multiplying factor N is 2 to 128, a modulation sensitivity $K_V$ of the VCO 15 is in a range of 67.3 MHz to 401 MHz to a control voltage of 1V fed from the LPF 14. On an other hand, the resistance R of the resistor 6 constituting the LPF 14 is set to 33 k$\square$, the capacitance $C_1$ of the capacitor 7 also constituting the LPF 14 is set to 80 pF and the capacitance $C_2$ of the capacitor 8 constituting the LPF 14 is set to 8 pF. As a result, the open loop gain G(s) of the PLL changes greatly. Moreover, since a phase margin is small, a lock-up time is long and the PLL cannot be resistant against disturbance. Therefore, if the control current $I_C$ of the charge pump 13 can be switched based on the 2-bit oscillation frequency band setting data $DT_F$ and the 7-bit multiplying factor setting data $DT_D$, the open loop gain G(s) of the PLL can be controlled, as a result. That is, as is apparent from the above equation (1), though the open loop gain G(s) of the PLL is varied greatly by changes in the modulation sensitivity $K_V$ of the VCO 15 and in the multiplying factor N, by compensating for changed amount in the modulation sensitivity $K_V$ of the VCO and in the multiplying factor N, that is, by switching the control current $I_C$ of the charge pump 13 so that changes in a quotient ($K_V$/N) of the modulation sensitivity $K_V$ and the multiplying factor N are compensated for, changes in the open loop gain G(s) of the PLL can be controlled so that it falls within a predetermined range. If the changes in the open loop gain G(s) of the PLL can be controlled so that it is within the predetermined range, since the gain diagram does not present such a great change as shown in (1) of FIG. 12, even if the capacitance $C_1$ of the capacitor 7 constituting the LPF 14 is set to a small value as in the first embodiment, it is possible to obtain enough phase margin. Therefore, when a sufficient phase margin is obtained, as shown by the curve "b" in FIG. 13, damping factor of the PLL is made large and lock-up time is shortened and becomes resistant against disturbance and jitter decreases.

Next, operations of the PLL having configurations described above will be explained below.

The 2-bit oscillation frequency band setting data $DT_F$ (for example, 00) for setting the first range (50 MHz to 80 MHz) is fed from the CPU (not shown) to the VCO 15 and the decoder 12 and simultaneously the 7-bit multiplying factor setting data $DT_D$ (for example, 0000001) for setting, for example, "3" as the multiplying factor N, selected out of the multiplying factors N contained in the first range (2 to 5) is fed from the CPU to the frequency divider 16 and the decoder 12. This causes the decoder 12 to generate the active-high control current setting signal $S_2$ (see FIG. 2) for setting the constant current $I_{C2}$ as the control current $I_C$ of the charge pump 13 based on the 2-bit oscillation frequency band setting data $DT_F$ (00) and on the 7-bit multiplying factor setting data $DT_D$ (0000001) and to feed it to the charge pump 13.

Therefore, in the charge pump 13, since each of the n-channel MOS transistors $23_2$ and $24_2$ is turned ON by the active-high control current setting signal $S_2$, when the active-low up-clock/UCK is fed from the phase frequency comparator 11, the constant current $I_{C2}$ fed from the constant current source $21_2$ flows out as the control current $I_C$ through the p-channel MOS transistor 26 which has been turned ON on the active-low up-clock/UCK and puts charge in the capacitors 7 and 8 constituting the LPF 14, and when the active-high down-clock DCK is fed from the phase frequency comparator 11, the constant current $I_{C2}$ from the constant current source $22_2$ flows in through the n-channel MOS transistor 25 which has been turned ON on the active-high down-clock DCK. Moreover, other operations of each of the PLL parts in the first embodiment are same as in the conventional PLL and therefore descriptions of them will be omitted.

Second Embodiment

Figure 4:
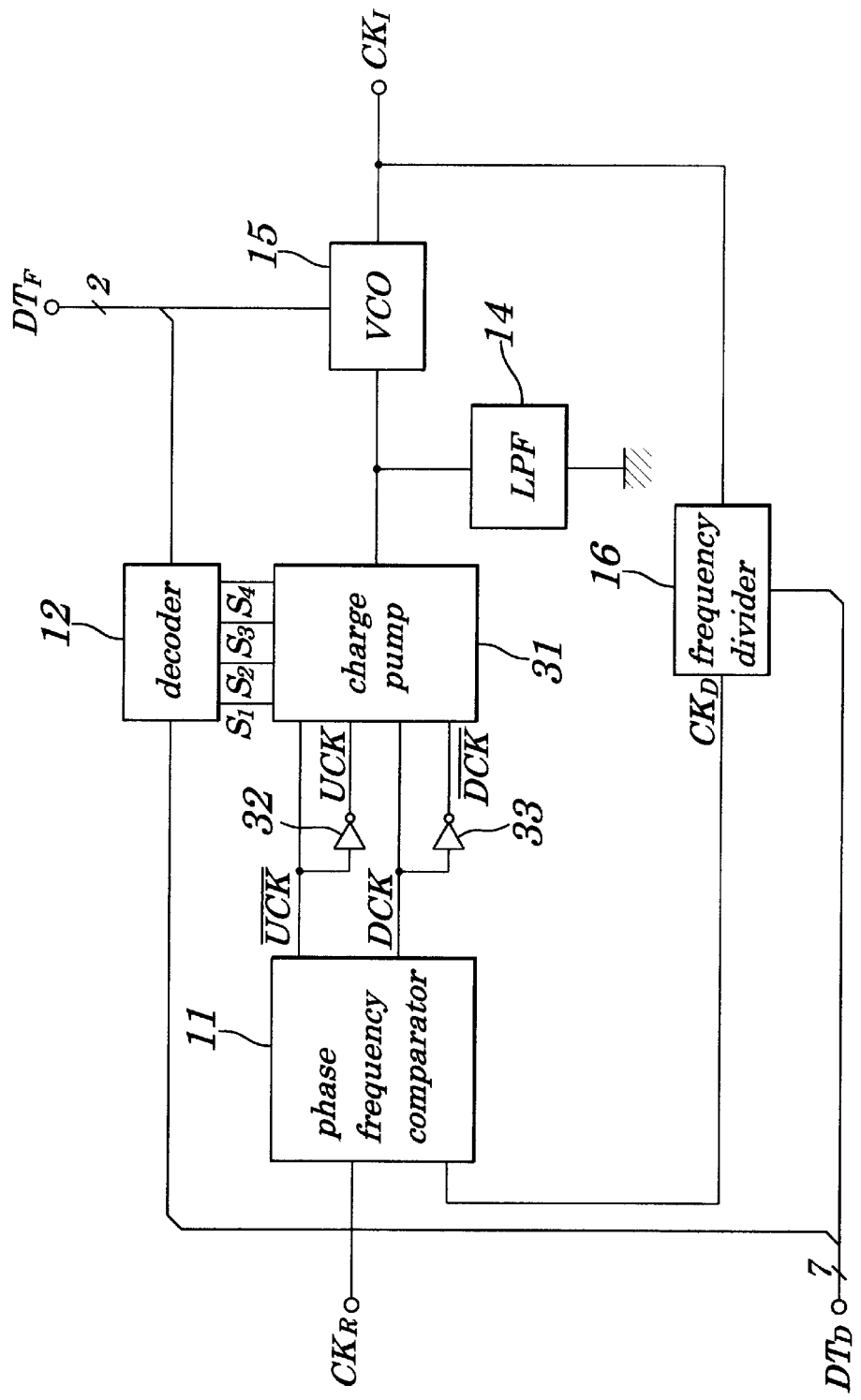
FIG. 4 is a schematic block diagram showing configurations of a PLL according to a second embodiment of the present invention.

FIG. 4 is a schematic block diagram showing configurations of a PLL according to a second embodiment of the present invention. In FIG. 4, same reference numbers are assigned to parts having same functions as in FIG. 1 and descriptions of them are omitted. In the PLL of the second embodiment, a charge pump 31 is newly provided instead of a charge pump 13 shown in FIG. 1 and inverters 32 and 33 are newly mounted. The inverter 32 inverts an active-low up-clock/UCK and feeds as an up-clock UCK to the charge pump 31. The inverter 33 inverts an active-high down-clock DCK and feeds as a down-clock/DCK to the charge pump 31.

Figure 5:
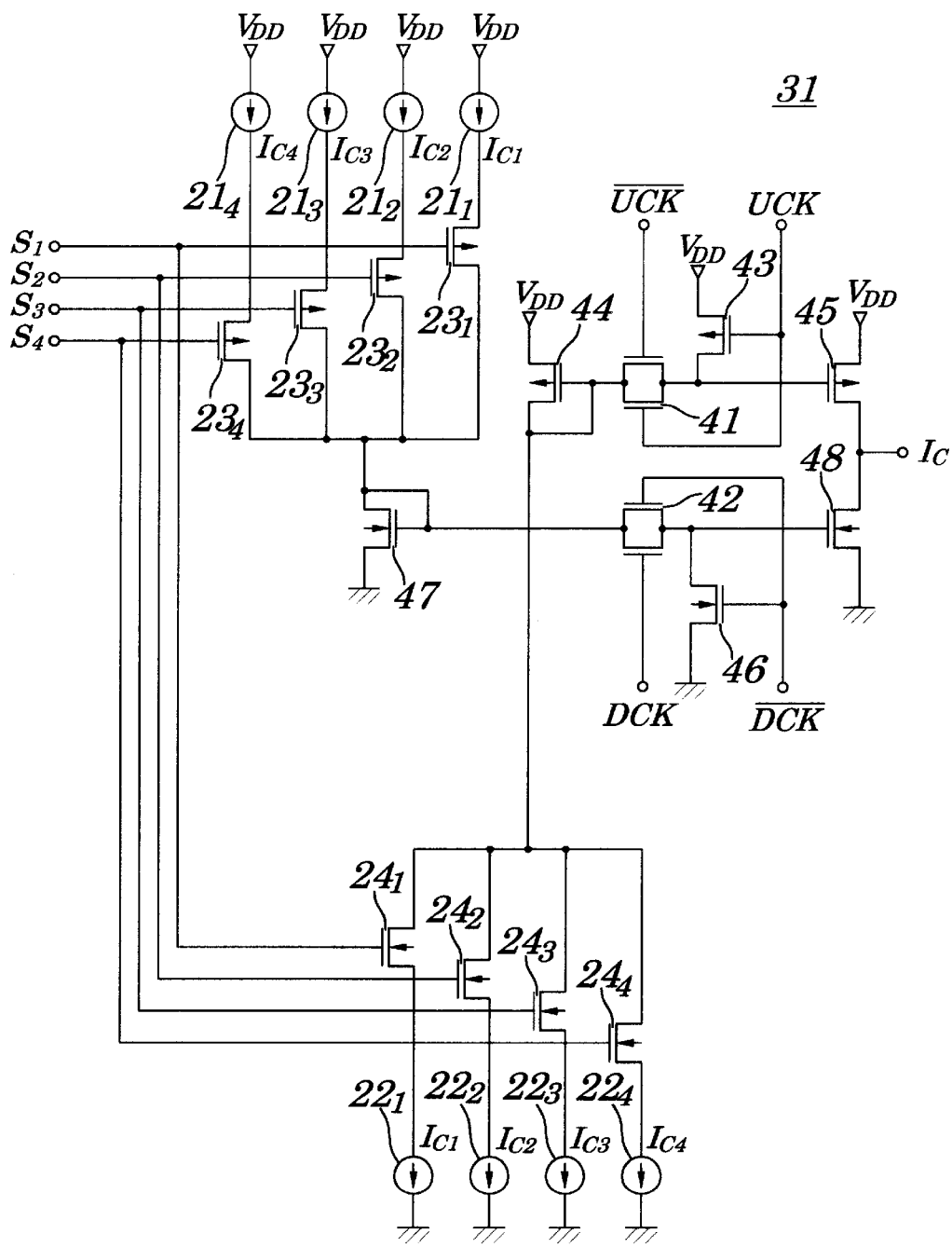
FIG. 5 is a schematic circuit diagram showing one example of configurations of a charge pump constituting the PLL according to the second embodiment of the present invention.

FIG. 5 is a schematic circuit diagram showing one example of configurations of the charge pump 31 constituting the PLL of the second embodiment. In FIG. 5, same reference numbers are assigned to parts having same functions as in FIG. 3 and descriptions of them are omitted. In the charge pump 31 of the second embodiment, instead of the n-channel MOS transistor 25 and p-channel MOS transistor 26, transfer gates 41 and 42 are newly mounted and n-channel MOS transistors 43 to 45 and p-channel MOS transistors 46 to 48 are additionally provided. The transfer gate 41 is turned ON when the active-low up-clock/UCK and the up-clock UCK are applied across the transfer gate 41 to connect the n-channel MOS transistor 44 with the n-channel MOS transistor 45. The transfer gate 42 is turned ON when an active-high down-clock DCK and a down-clock/DCK are applied across the transfer gate 42 to connect the p-channel MOS transistor 47 with the p-channel MOS transistor 48.

The n-channel MOS transistor 43, when an up-clock UCK is applied thereto, pulls up a gate voltage of the n-channel MOS transistor 45 to a level of a supply voltage $V_{DD}$. A gate of the n-channel MOS transistor 44 is connected to a gate of the n-channel MOS transistor 45 when the transfer gate 41 is turned ON and, when application of supply voltage $V_{DD}$ to the gate of the n-channel MOS transistor 45 is stopped because the n-channel MOS transistor 43 is turned OFF, by Miller effect, a current having an amount approximately equal to that of any one of constant currents $I_{C1}$ to $I_{C4}$ flowing in the n-channel MOS transistor 44 through any one of the n-channel MOS transistors $24_1$ to $24_4$ which has been turned ON by any one of active-high control current setting signals $S_1$ to $S_4$, flows through the n-channel MOS transistor 45 and the current is flowed out as a control current $I_C$. The p-channel MOS transistor 46 is turned ON by application of the down-clock/DCK and pulls down a gate voltage of the p-channel MOS transistor 48 to a ground level. When the transfer gate 42 is turned ON, a gate of the p-channel MOS transistor 47 is connected to a gate of the p-channel MOS transistor 48 and, when grounding of the gate of the p-channel MOS transistor 48 is stopped because the p-channel MOS transistor 46 is turned OFF, by the Miller effect, a current having an amount approximately equal to that of any one of the constant currents $I_{C1}$ to $I_{C4}$ flowing in the p-channel MOS transistor 47 through any one of the n-channel MOS transistors $23_1$ to $23_4$ which has been turned ON by any one of active-high control current setting signals $S_1$ to $S_4$, flows as a control current $I_C$, into the p-channel MOS transistor 48.

Next, operations of the PLL of the second embodiment will be described below.

First, 2-bit oscillation frequency band setting data $DT_F$ (for example, 01) for setting a second range (80 MHz to 125 MHz) of frequency bands is supplied by a CPU (not shown) to VCO 15 and decoder 12 and, simultaneously, 7-bit multiplying factor setting data $DT_D$ (for example, 100111) for setting, for example, "40" as a multiplying factor N, selected out of the multiplying factors N contained in a third range (17 to 45) is supplied by the CPU to frequency divider 16 and the decoder 12. This causes the decoder 12 to generate an active-high control current setting signal $S_3$ (see FIG. 2) for setting constant current $I_{C3}$ as control current $I_C$ of the charge pump 31 based on the 2-bit oscillation frequency band setting data $DT_F$ (01) and on the 7-bit multiplying factor setting data $DT_D$ (100111) and to feed the charge pump 31. Therefore, in the charge pump 31, each of the n-channelMOS transistors $23_3$ and $24_3$ is turned ON by the active-high control current setting signal $S_3$. This causes phase frequency comparator 11 to feed the active-low up-clock/UCK and, when the up-clock UCK is fed from the inverter 32, the transfer gate 41 is turned ON to cause the gate of the n-channel MOS transistor 44 to be connected to the gate of the n-channel MOS transistor 45 and, at a same time, the n-channel MOS transistor 43 is turned OFF to cause application of the supply voltage $V_{DD}$ to the gate of the MOS transistor to be stopped. Therefore, by the Miller effect, a current having an amount approximately equal to that of the constant current $I_{C3}$ flowing in the n-channel MOS transistor 44 through the n-channel MOS transistor $24_3$ which has been turned ON by the active-high control current setting signal $S_3$, flows through the n-channel MOS transistor 45 and the current flows out as the control current $I_C$ to put charge in capacitors 7 and 8 constituting LPF 14.

On the other hand, if the active-high down-clock DCK is fed from the phase frequency comparator 11 and the down-clock/DCK is supplied from the inverter 33, the transfer gate 42 is turned ON to cause the gate of the p-channel MOS transistor 47 to be connected to the gate of the p-channel MOS transistor 48 and simultaneously the MOS transistor 46 is turned OFF to cause grounding of the gate of the p-channel MOS transistor 48 to be stopped. Therefore, by the Miller effect, a current having an amount approximately equal to that of the constant current $I_{C3}$ flowing in the p-channel MOS transistor 47 through the n-channel MOS transistor $23_3$ which has been turned ON by the active-high control current setting signal $S_3$, flows in the p-channel MOS transistor 48 as a control current $I_C$. Other operations of the PLL are the same as those a conventional PLL and descriptions of them are omitted accordingly.

According to the second embodiment, in addition to effects obtained by the first embodiment, an effect of preventing noise occurring at a time of supply of the up-clock/UCK or down-clock DCK, can be obtained. That is, in the charge pump 13 shown in FIG. 3, since the n-channel MOS transistor 25 and p-channel MOS transistor 26 serve as both a switching transistor and an output transistor, when the n-channel MOS transistor 25 and p-channel MOS transistor 26 are turned ON on the up-clock/UCK or down-clock DCK, noise caused by parasitic capacity of each of the n-channel MOS transistor 25 and p-channel MOS transistor 26 is apt to occur. In the PLL of the second embodiment, since the supply voltage $V_{DD}$ is applied to each of drains of the n-channel MOS transistor 45 and the P-channel MOS transistor 48 serving as the output transistor or each of the drains is grounded, even when the transfer gate 41 or 42 is turned ON, a voltage in each of the drains of the n-channel MOS transistor 45 or the p-channel MOS transistor 48 is constant, thereby preventing occurrence of the noise.

Third Embodiment

Figure 6:
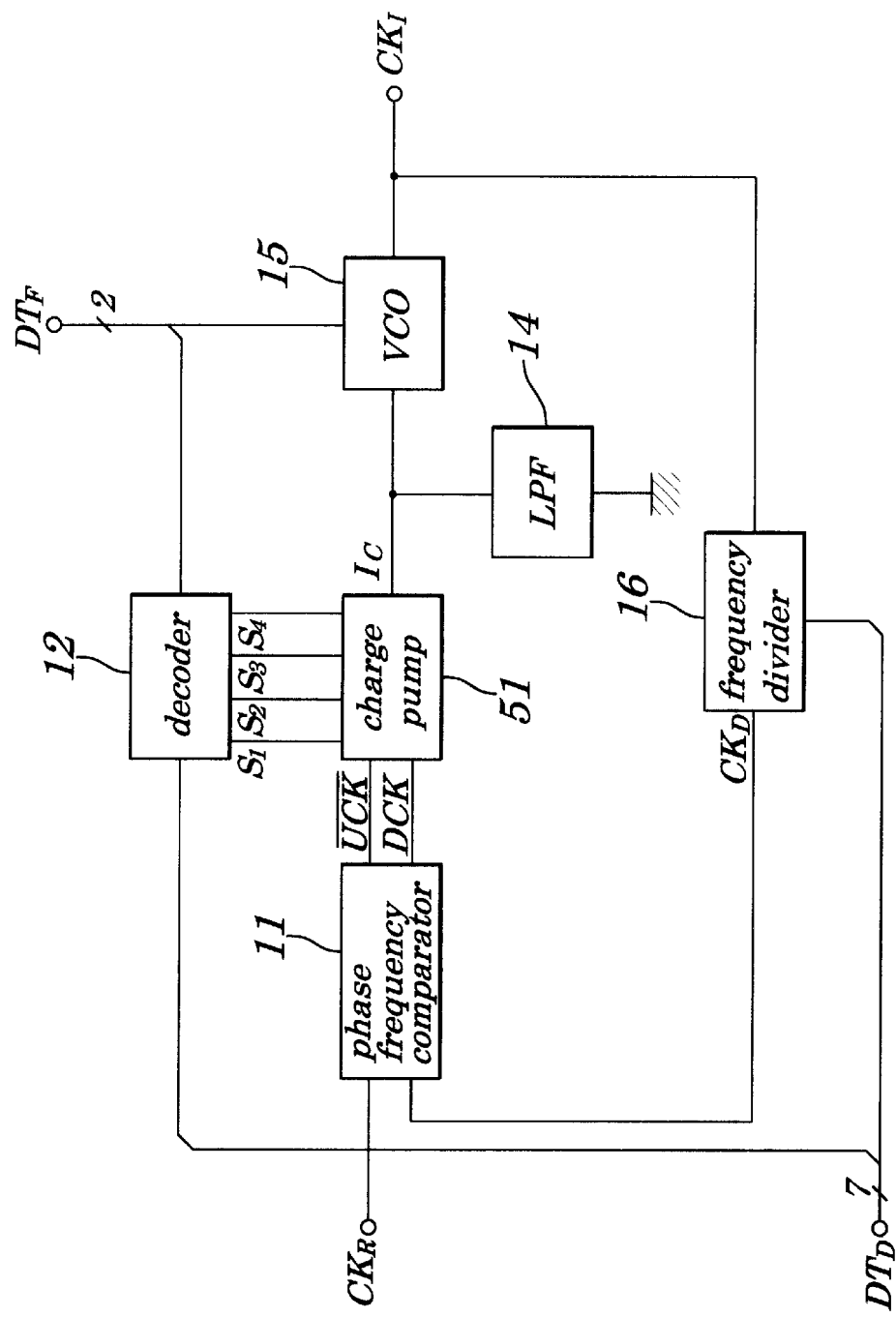
FIG. 6 is a schematic block diagram showing configurations of a PLL according to a third embodiment of the present invention.
Figure 7:
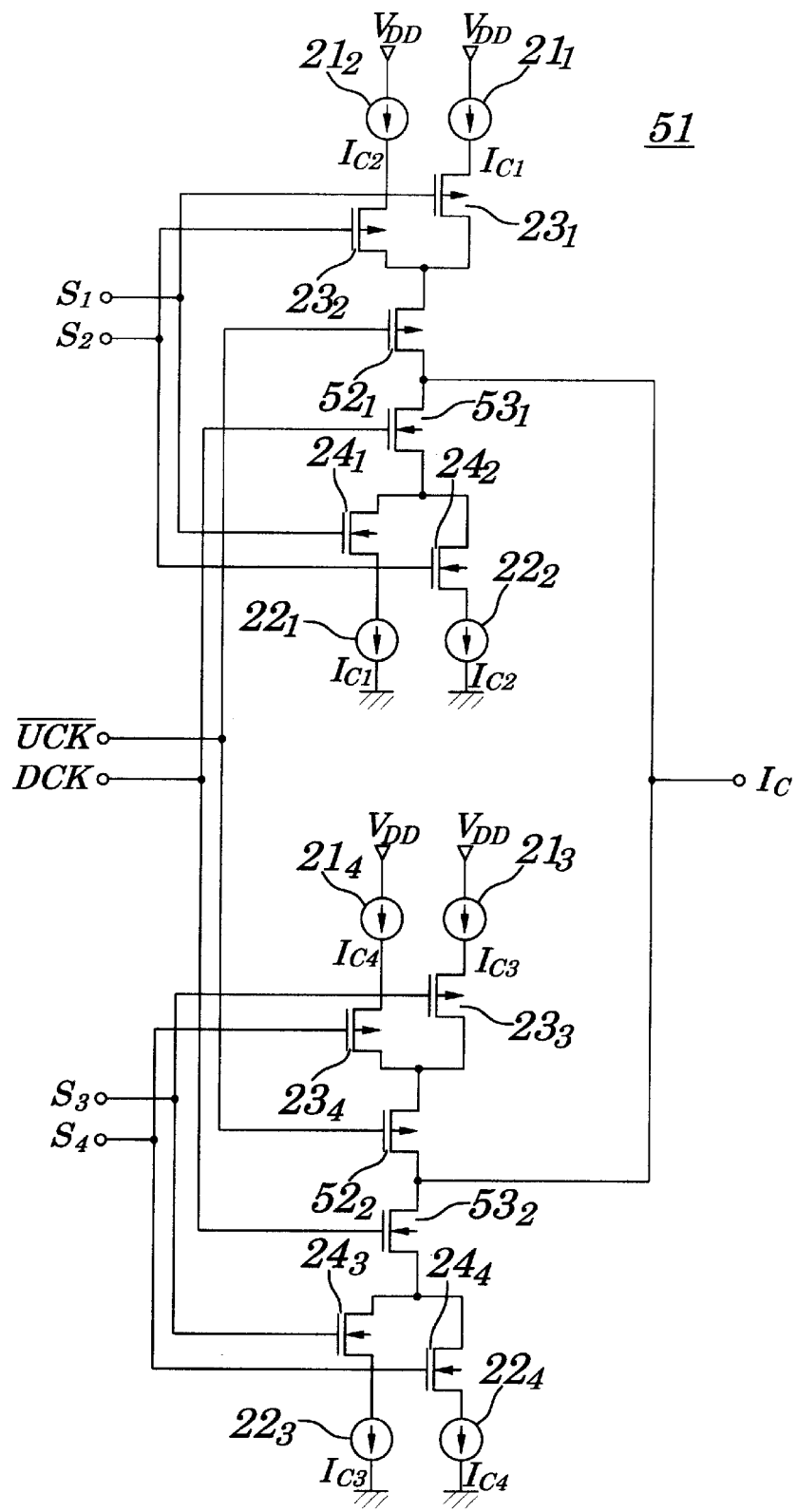
FIG. 7 is a schematic circuit diagram showing one example of configurations of a charge pump constituting the PLL according to the third embodiment of the present invention.

FIG. 6 is a schematic block diagram showing configurations of a PLL according to a third embodiment of the present invention. In FIG. 6, same reference numbers are assigned to parts having same functions as in FIG. 1 and descriptions of them are omitted. In the third embodiment, instead of a charge pump 13 shown in FIG. 1, a charge pump 51 is newly mounted. FIG. 7 is a schematic circuit diagram showing one example of configurations of the charge pump 51 constituting the PLL according to the third embodiment. In FIG. 6, same reference numbers are assigned to parts having same functions as those in FIG. 3 and descriptions of them are omitted. In the charge pump 51 shown in FIG. 7, instead of n-channel MOS transistor 25 and p-channel MOS transistor 26, n-channel MOS transistors $52_1$ and $52_2$ and p-channel MOS transistors $53_1$ and $53_2$ are newly mounted and there are provided two divided blocks, one where constant currents $I_{C1}$ and $I_{C2}$ flow in or out and an other where constant currents $I_{C3}$ and $I_{C4}$ flow in and out. N-channel MOS transistors $23_1$ and $23_2$ are turned ON by corresponding active-high control current setting signals $S_1$ and $S_2$ respectively and cause constant currents $I_{C1}$ and $I_{C2}$ supplied by corresponding constant current sources $21_1$ and $21_2$ to flow out as control currents $I_C$ through the n-channel MOS transistor $52_1$ which has been turned ON on an active-low up-clock/UCK. N-channel MOS transistors $23_3$ and $23_4$ are turned ON by corresponding active-high control current setting signals $S_3$ and $S_4$ respectively and cause constant currents $I_{C3}$ and $I_{C4}$ supplied by corresponding constant current sources $21_3$ and $21_4$ to flow out as control currents $I_C$ through the n-channel MOS transistor $52_2$ which has been turned ON on the active-low up-clock/UCK. The n-channel MOS transistors $24_1$ and $24_2$ are turned ON by corresponding active-high control current setting signals $S_1$ and $S_2$ respectively and cause constant currents $I_{C1}$ and $I_{C2}$ supplied by corresponding constant current sources $22_1$ and $22_2$ to flow in as control currents $I_C$ through the p-channel MOS transistor $53_1$ which has been turned ON on an active-high down-clock DCK. N-channel MOS transistors $24_3$ and $24_4$ are turned ON by corresponding active-high control current setting signals $S_3$ and $S_4$ respectively and cause constant currents $I_{C3}$ and $I_{C4}$ supplied by corresponding constant current sources $22_3$ and $22_4$ to flow in as control currents $I_C$ through the p-channel MOS transistor $53_2$ which has been turned ON on the active-high down-clock DCK. Moreover, operations of each of PLL parts are approximately same as those in the first embodiment and descriptions of them are omitted.

Thus, according to the third embodiment, in addition of effects obtained in the first embodiment, an effect of optimization of circuit characteristics of the PLL can be obtained. That is, as is apparent from FIG. 3, though the constant currents $I_{C1}$ to $I_{C4}$ as control currents $I_C$ flow through n-channel MOS transistor 25 and p-channel MOS transistor 26, since amounts of the constant current $I_{C4}$ (16.3 μA) are twenty times or more larger than those of the constant current $I_{C1}$ (0.78 μA), to cause such the current having a large range of amounts to flow through the n-channel MOS transistor 25 and p-channel MOS transistor 26, circuit characteristics must be somewhat sacrificed. In the PLL of the third embodiment, the charge pump 51 is so constructed that there are provided two divided blocks, one where constant currents $I_{C1}$ and $I_{C2}$ flow in or out and the other where constant currents $I_{C3}$ and $I_{C4}$ flow in or out, and the control currents $I_C$ flowing through the n-channel MOS transistor $52_1$ and p-channel MOS transistor $53_1$ are the constant current $I_{C1}$ (0.78 µA) and the constant current $I_{C2}$ (2.3 µA) and the control currents $I_C$ flowing through the n-channel MOS transistor $52_2$ and p-channel MOS transistor $53_2$ are the constant current $I_{C3}$ (7.0 µA) and the constant current $I_{C4}$ (16.3 µA). In both cases of above blocks, range of differences in currents is two to three times. It is, therefore, comparatively easy to fabricate the n-channel MOS transistor $52_1$ and p-channel MOS transistor $53_1$ and the n-channel MOS transistor $52_2$ and p-channel MOS transistor $53_2$ each of a combination having the range of differences in currents being only two to three times, thus enabling optimization of circuit characteristics.

Fourth Embodiment

Figure 8:
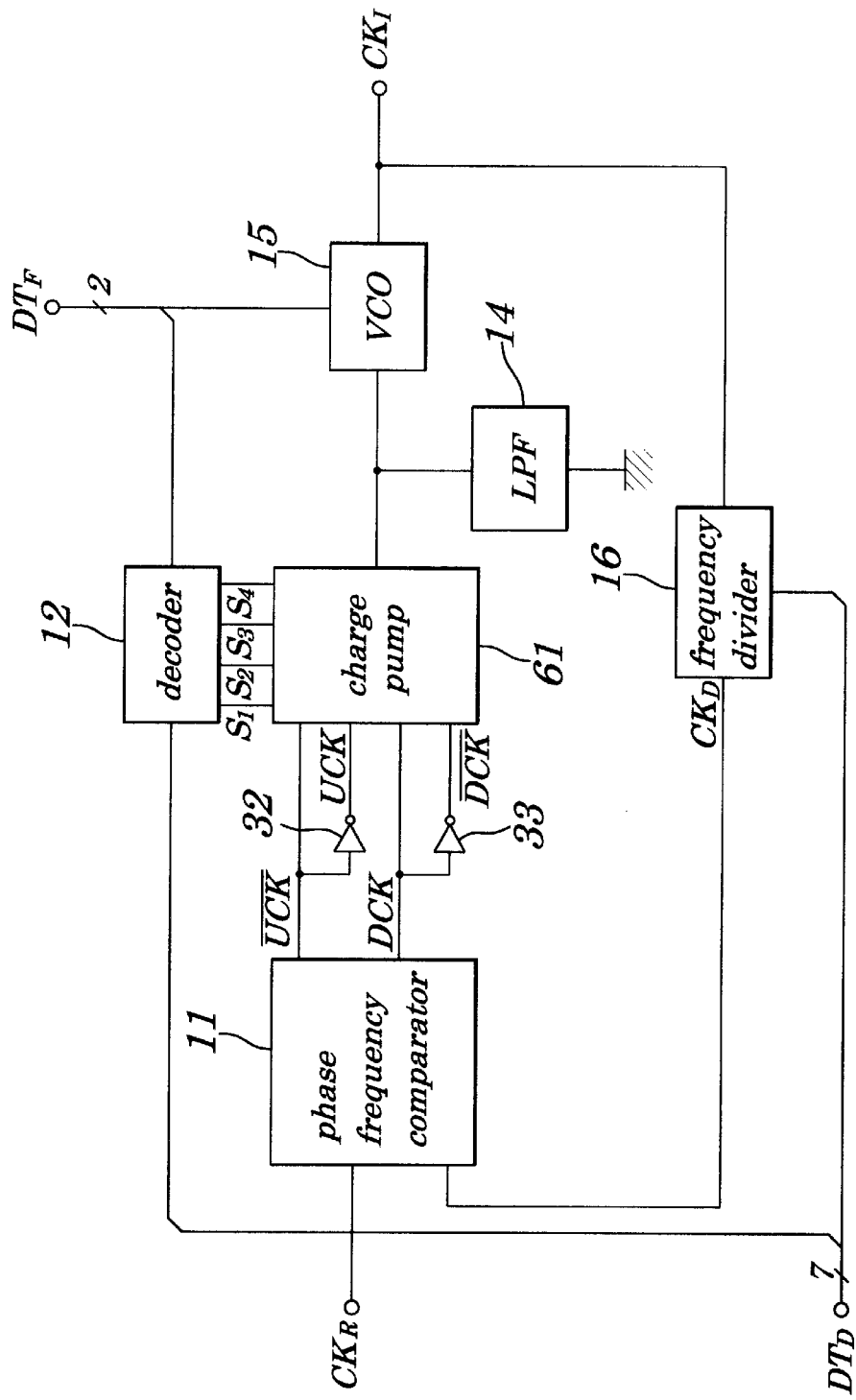
FIG. 8 is a schematic block diagram showing configurations of a PLL according to a fourth embodiment of the present invention.

FIG. 8 is a schematic block diagram showing configurations of a PLL according to a fourth embodiment of the present invention. In FIG. 8, same reference numbers are assigned to parts having same functions as in FIG. 4 and descriptions of them are omitted. In the PLL of the fourth embodiment, instead of a charge pump 31 shown in FIG. 4, a charge pump 61 is newly mounted.

Figure 9:
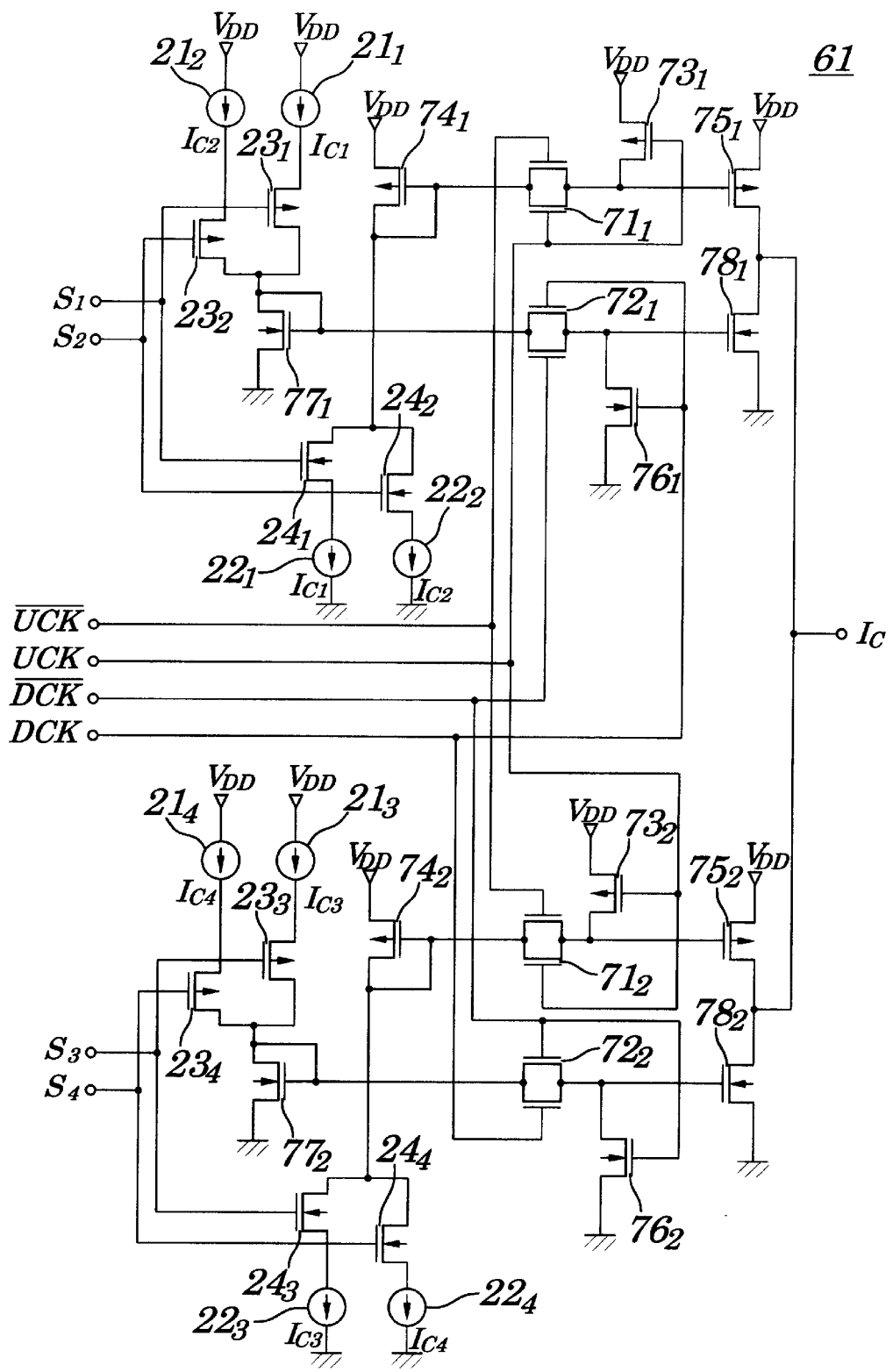
FIG. 9 is a schematic circuit diagram showing one example of configurations of a charge pump constituting the PLL according to the fourth embodiment of the present invention.
Figure 10:
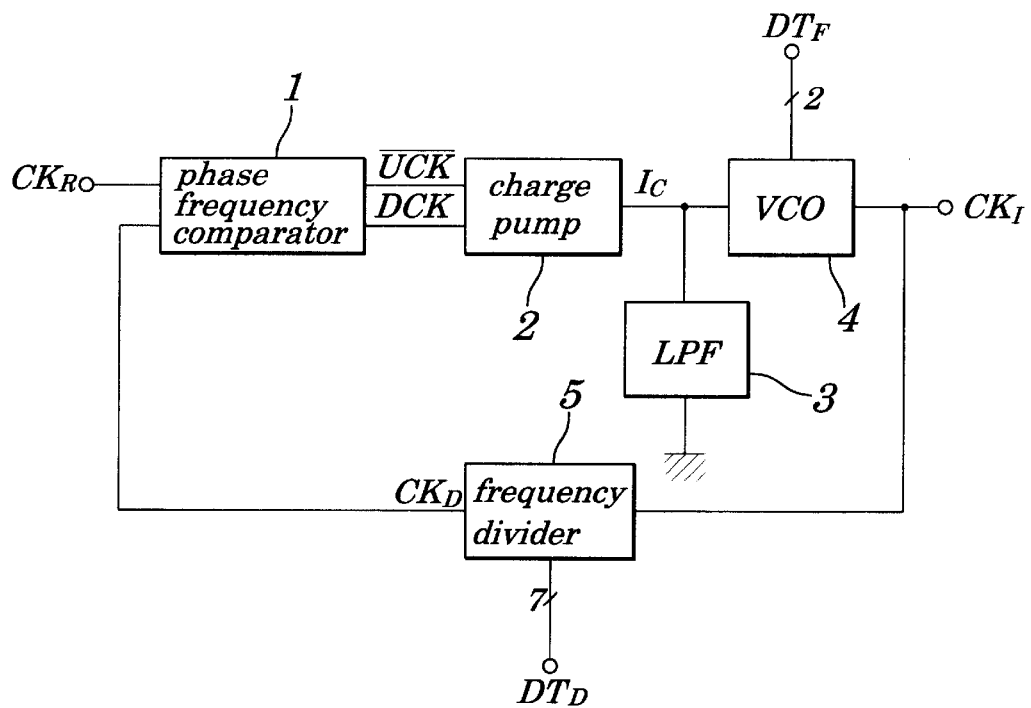
FIG. 10 is a schematic block diagram showing an example of configurations of a conventional PLL.

FIG. 9 is a schematic circuit diagram showing one example of configurations of the charge pump 61 constituting the PLL according to the fourth embodiment. In FIG. 9, same reference numbers are assigned to parts having same functions as in FIG. 5 and descriptions of them are omitted. In the charge pump 61 shown in FIG. 9, instead of transfer gates 41 and 42 and n-channel MOS transistors 43 to 45, p-channel MOS transistors 46 to 48, transfer gates $71_1$, $71_2$, $72_1$ and $72_2$, n-channel MOS transistors $73_1$, $73_2$, $74_1$, $74_2$, $75_1$ and $75_2$, p-channel MOS transistors $76_1$, $76_2$, $77_1$, $77_2$, $78_1$ and $78_2$ are newly mounted, and there are provided two divided blocks, one where constant currents $I_{C1}$ and $I_{C2}$ flow in or out and an other where constant currents $I_{C3}$ and $I_{C4}$ flow in or out.

The transfer gate $71_1$ is turned ON when an active-low up-clock/UCK and up-clock UCK are applied across the transfer gate $71_1$ and is adapted to connect a gate of the n-channel MOS transistor $74_1$ with a gate of the n-channel MOS transistor $75_1$. The transfer gate $71_2$ is turned ON when the active-low up-clock/UCK and up-clock UCK are applied across the transfer gate $71_1$ and is adapted to connect a gate of the n-channel MOS transistor $74_2$ with a gate of the n-channel MOS transistor $75_2$. The transfer gate $72_1$ is turned ON when an active-high down-clock DCK and down-clock/DCK are applied across the transfer gate $72_1$ and is adapted to connect a gate of the p-channel MOS transistor $77_1$ with a gate of the p-channel MOS transistor $78_1$. The transfer gate $72_2$ is turned ON when the active-high down-clock DCK and down-clock/DCK are applied across the transfer gate $72_2$ and is adapted to connect a gate of the p-channel MOS transistor $77_2$ with a gate of the p¥channel MOS transistor $78_2$.

The n-channel MOS transistor $73_1$ is turned ON by a supply of the up-clock UCK and pulls up a gate voltage of the n-channel MOS transistor $75_1$ to a level of a supply voltage $V_{DD}$. When the transfer gate $71_1$ is turned ON, a gate of the n-channel MOS transistor $74_1$ is connected to a gate of the n-channel MOS transistor $75_1$. When application of the supply voltage $V_{DD}$ to the gate of the n-channel MOS transistor $75_1$ is stopped because the n-channel MOS transistor $73_1$ is turned ON, by Miller effect, a current having an amount approximately equal to that of the constant current $I_{C1}$ or $I_{C2}$ flowing in the n-channel MOS transistor $74_1$ through either of n-channel MOS transistors $24_1$ or $24_2$ which has been turned ON by either of the active-high control current setting signal $S_1$ or $S_2$, flows through the n-channel MOS transistor $75_1$ and this current flows out as the control current $I_C$.

The n-channel MOS transistor $73_2$ is turned ON by a supply of the up-clock UCK and pulls up a gate voltage of the n-channel MOS transistor $75_2$ to a level of the supply voltage $V_{DD}$. When the transfer gate $71_2$ is turned ON, a gate of the n-channel MOS transistor $74_2$ is connected to the gate of the n-channel MOS transistor $75_2$. When application of the supply voltage $V_{DD}$ to the gate of the n-channel MOS transistor $75_2$ is stopped because the n-channel MOS transistor $73_2$ is turned ON, by the Miller effect, a current having an amount approximately equal to that of the constant current $I_{C3}$ or $I_{C4}$ flowing in the n-channel MOS transistor $74_2$ through either of the n-channel MOS transistors $24_3$ or $24_4$ which has been turned ON by either of the active-high control current setting signal $S_3$ or $S_4$, flows through the n-channel MOS transistor $75_2$ and this current flows out as the control current $I_C$.

The p-channel MOS transistor $76_1$ is turned ON by a supply of a down-clock/DCK and pulls down a gate voltage of the p-channel MOS transistor $78_1$ to a level of ground. When the transfer gate $72_1$ is turned ON, a gate of the p-channel MOS transistor $77_1$ is connected to a gate of the p-channel MOS transistor $78_1$. When grounding of the gate of the p-channel MOS transistor $78_1$ is stopped because the p-channel MOS transistor $76_1$ is turned OFF, by the Miller effect, a current having an amount approximately equal to that of the constant current $I_{C1}$ or $I_{C2}$ flowing in the p-channel MOS transistor $77_1$ through either of the n-channel MOS transistors $23_1$ or $23_2$ which has been turned ON by either of the active-high control current setting signal $S_1$ or $S_2$, flows through the p-channel MOS transistor $78_1$ and this current flows out as the control current $I_C$.

The p-channel MOS transistor $76_2$ is turned ON by a supply of a down-clock/DCK and pulls down a gate voltage of the p-channel MOS transistor $78_2$ to a level of ground. When the transfer gate $72_2$ is turned ON, a gate of the p-channel MOS transistor $77_2$ is connected to a gate of the p-channel MOS transistor $78_2$. When grounding of the gate of the p-channel MOS transistor $78_2$ is stopped because the p-channel MOS transistor $76_2$ is turned OFF, by the Miller effect, a current having an amount approximately equal to that of the constant current $I_{C1}$ or $I_{C2}$ flowing in the p-channel MOS transistor $77_2$ through either of the n-channel MOS transistors $23_3$ or $23_4$ which has been turned ON by either of the active-high control current setting signal $S_3$ or $S_4$, flows through the p-channel MOS transistor $78_2$ and this current flows out as the control current $I_C$.

Moreover, operations of each of the PLL parts are approximately the same as those in the second embodiment and descriptions of them are omitted.

Thus, according to the fourth embodiment, in addition of the effects obtained in the third embodiment, effects of optimization of circuit characteristics and of prevention of malfunctions in the PLL circuit can be obtained. That is, as is apparent from FIG. 3, though the constant currents $I_{C1}$ to $I_{C4}$ as control currents $I_C$ flow through the n-channel MOS transistor 44 and p-channel MOS transistor 47, since amounts of the constant current $I_{C4}$ (16.3 µA) are twenty times or more larger than those of the constant current $I_{C1}$ (0.78 μA), to cause such the current having a large range of amounts to flow through the n-channel MOS transistor 44 and p-channel MOS transistor 47, circuit characteristics must be somewhat sacrificed. If such the current having a large range of amounts flow through the n-channel MOS transistor 44 and p-channel MOS transistor 47, since a voltage $V_{GS}$ between a gate and a source of the n-channel MOS transistor 44 and p-channel MOS transistor 47 changes greatly, the MOS transistor 44 and p-channel MOS transistor 47 become unsaturated and the Miller effect cannot be sufficiently obtained in some cases. This causes no flowing of the current, through the n-channel MOS transistor 45 and p-channel MOS transistor 48, having an amount approximately equal to that of the current flowing in the n-channel MOS transistor 44 and p-channel MOS transistor 47, thus leading to a malfunction of the circuit. In the PLL of the fourth embodiment, the charge pump 61 is so constructed that there are provided two divided blocks, one where constant currents $I_{C1}$ and $I_{C2}$ flow in or out and the other where constant currents $I_{C3}$ and $I_{C4}$ flow in or out, and an control currents $I_C$ flowing through the n-channel MOS transistor $74_1$ and p-channel MOS transistor $77_1$ are the constant current $I_{C1}$ (0.78 μA) and the constant current $I_{C2}$ (2.3 μA) and the control currents $I_C$ flowing through the n-channel MOS transistors $74_2$ and p-channel MOS transistor $77_2$ are the constant current $I_{C3}$ (7.0 μA) and the constant current $I_{C4}$ (16.3 μA). In both cases of above blocks, the range of differences in currents is 2 to 3 times. It is, therefore, comparatively easy to fabricate the n-channel MOS transistors $74_1$ and p-channel MOS transistor $77_1$ and the n-channel MOS transistors $74_2$ and p-channel MOS transistor $77_2$ each of a combination having a range of differences in currents being only two to three times, thus enabling optimization of circuit characteristics.

Moreover, since the range of difference in currents flowing in the n-channel MOS transistor $74_1$ and p-channel MOS transistor $77_1$ and the n-channel MOS transistor $74_2$ and p-channel MOS transistor $77_2$ is only two to three times, changes in voltages $V_{GS}$ between gates and sources of the n-channel MOS transistor $74_1$ and p-channel MOS transistor $77_1$ and the n-channel MOS transistor $74_2$ and p-channel MOS transistor $77_2$ are small and therefore the n-channel MOS transistor $74_1$ and p-channel MOS transistor $77_1$ and the n-channel MOS transistor $74_2$ and p-channel MOS transistor $77_2$ do not become unsaturated, thus enabling the Miller effect to be obtained sufficiently. Accordingly, a current having an amount approximately equal to that of the constant current flowing in the n-channel MOS transistor $74_1$ and p-channel MOS transistor $77_1$ and in the n-channel MOS transistor $74_2$ and p-channel MOS transistor $77_2$, flows through the n-channel MOS transistor $75_1$ and p-channel MOS transistor $78_1$ and the n-channel MOS transistor $75_2$ and p-channel MOS transistor $78_2$, thus causing no danger of a malfunction in the circuit.

As described above, according to the present invention, since the PLL is so configured that a value of the control current flowing in or out from the charge pump can be changed in accordance with modulation sensitivity and/or oscillation frequency band of a VCO and with multiplying factor of an LPF, even if both the oscillation frequency band and a changeable range of the multiplying factor are wide, an area occupied by the PLL in a chip of a semiconductor device can be reduced, a lock-up time can be also shortened and a high resistance against disturbance can be achieved.

Also, according to the present invention, since the charge pump of the PLL is so configured that devices to switch between a function of flow-in and a function of flow-out of control currents and devices to receive or release control currents are mounted in a separated state, noise is hardly produced at a time of supply of an up-clock or down-clock.

Moreover, according to the present invention, since the charge pump of the PLL is so configured that constant current sources are divided into a plurality of blocks each having constant current sources whose constant currents are similar or near to each other and each of the blocks is provided with devices to select any one of the constant current sources, devices to switch between the function of flow-in and function of flow-out of control currents and devices to receive or release control currents, optimization of circuit characteristics can be achieved.

Furthermore, according to the present invention, since the charge pump of the PLL is so configured that constant current sources are divided into a plurality of blocks each having constant current sources whose constant currents are similar to each other and that each block is provided with devices to select any one of the constant current sources, devices to switch between the function of flow-in and the function of flow-out of control currents and devices to receive or release control currents, and further switching devices and receiving/releasing devices are mounted in a separated state in each block, malfunctions in the circuit can be effectively prevented.

It is apparent that the present invention is not limited to the above embodiments but may be changed and modified without departing from the scope and spirit of the invention. For example, in the above embodiments, the PLL is composed of the phase frequency comparator, charge pump, LPF, VCO and frequency divider, however, the present invention may be applied to any type of the PLL, so long as it is composed of, at least, the phase frequency comparator, charge pump, LPF, VCO and frequency divider, including a fixed pre-scaler type PLL in which a pre-scaler is mounted in a front stage thereof and a pulse swallow type PLL in which a pre-scaler and a swallow counter are mounted or a like. Moreover, in the above embodiments, a phase frequency comparator 11 is adapted to detect a difference in a phase frequency between a reference clock $CK_R$ and a frequency-divided clock $CK_D$ to be supplied from a frequency divider 16 and to feed an up-clock/UCK (active-low) or a down-clock DCK (active-high) having a pulse width corresponding to the difference in the phase frequency, however, logic employed in the up-clock and down-clock may be changed if necessary. The phase frequency comparator 11 may be configured that it feeds an up-clock or down-clock having a number of pulses corresponding to a difference in a phase frequency. Also, in the above embodiments, a decoder 12 is adapted to generate any one of control current setting signals $S_1$ to $S_4$ in accordance with 2-bit oscillation frequency band setting data $DT_F$ and 7-bit multiplying factor setting data $DT_D$ and to feed it to the charge pump, however, as is apparent from equation (1), even if modulation sensitivity $K_V$ of VCO 15 and multiplying factor N are varied, no problem occurs only if a variation in an open loop gain G(s) of the PLL can fall within a predetermined range without changing a transfer function of the PLL; therefore, when the VCO 15 is so configured that it can change directly the modulation sensitivity $K_V$, a decoder may be so constructed that it generates any one of the control current setting signals $S_1$ to $S_4$ in accordance with a value of the modulation sensitivity $K_V$ to be fed from a CPU (not shown) and based on multiplying factor setting data $DT_D$ and feeds it to the charge pump.

Moreover, in the above embodiments, LPF 3, as shown in FIG. 11, is a secondary loop filter composed of a resistor 6 having resistance R and capacitor 7 having capacitance $C_1$ both of which are connected in series to each other and of capacitor 8 having capacitance $C_2$ which is connected in parallel to the resistor 6 and capacitor 7, however, any type of LPF can be employed so long as it can smooth the control current $I_C$ which flows in and out from the charge pump and can feed it as a control voltage to the VCO 15. In the above embodiment, relationssships among each of oscillation frequency band ranges of the VCO 15 including first to fourth ranges, each of multiplying factor ranges of the frequency divider 16 including first to fourth ranges and each of control current setting signals $S_1$ to $S_4$ are shown (in FIG. 2), however, a value of the oscillation frequency, a number of ranges of the oscillation frequency band of the VCO 15, a value of the multiplying factor N and number of ranges of the multiplying factor N of the frequency divider 16 may be changed.

Also, since the PLL of the present invention has a wide oscillation frequency band and a wide changeable range of the multiplying factor N, it can be used as a circuit block at a time of logical design of semiconductor devices according to conventional technology, however, it can be used in other various applications because it can change a frequency of an internal clock $CK_1$ based on the oscillation frequency band setting data $DT_F$ and multiplying factor setting data $DT_D$.

Furthermore, the PLL of the present invention may be also applied in a case where a frequency of an internal clock $CK_I$ is made lower to correspond to lower frequency of an operation clock of a CPU which is performed to reduce power consumption by operating necessary but minimum circuits only while, for example, a communication device having the PLL is waiting for signals or data from other communication devices.

What is claimed is:

1. A method of synchronizing a phase-locked loop composed of, at least, a phase frequency comparator to output an up-clock or a down-clock having a pulse width or a number of pulses corresponding to a difference in an oscillation frequency between a reference clock and a frequency-divided clock, a charge pump to cause a control current to flow in or out in accordance with said up-clock or said down-clock, a low pass filter to smooth said control current and to output it as a control voltage, a voltage controlled oscillator to oscillate an internal clock having an oscillation frequency corresponding to said control voltage in accordance with set modulation sensitivity and a frequency divider to divide a frequency of said internal clock in accordance with a set multiplying factor and to output it as said frequency-divided clock, said method of synchronizing a phase-locked loop comprising a step of changing a value of said control current in accordance with said set modulation sensitivity and with said set multiplying factor.

2. The method of synchronizing a phase-locked loop according to claim 1, wherein a value of said control current is changed in a manner so as to cause an open loop gain in said phase-locked loop to fall within a predetermined range.

3. A method of synchronizing a phase-locked loop composed of, at least, a phase frequency comparator to output an up-clock or a down-clock having a pulse width or a number of pulses corresponding to a difference in an oscillation frequency between a reference clock and a frequency-divided clock, a charge pump to cause a control current to flow in or out in accordance with said up-clock or said down-clock, a low pass filter to smooth said control current and to output it as a control voltage, a voltage controlled oscillator to oscillate an internal clock having an oscillation frequency corresponding to said control voltage in one oscillation frequency band selected out of a plurality of oscillation frequency bands and a frequency divider to divide a frequency of said internal clock in accordance with a set multiplying factor and to output it as said frequency-divided clock, said method of synchronizing a phase-locked loop comprising a step of changing a value of said control current in accordance with said one oscillation frequency band selected out and with said set multiplying factor.

4. The method of synchronizing a phase-locked loop according to claim 3, wherein a value of said control current is changed in a manner so as to cause an open loop gain in said phase-locked loop to fall within a predetermined range.

5. A phase-locked loop comprising:
    a phase frequency comparator to output an up-clock or a down-clock having a pulse width or a number of pulses corresponding to a difference in an oscillation frequency between a reference clock and a frequency-divided clock;
    a charge pump to cause a control current to flow in or out in accordance with said up-clock or said down-clock;
    a low pass filter to smooth said control current and to output it as a control voltage,
    a voltage controlled oscillator to oscillate an internal clock having an oscillation frequency corresponding to said control voltage in accordance with set modulation sensitivity;
    a frequency divider to divide a frequency of said internal clock in accordance with a set multiplying factor and to output it as said frequency-divided clock; and
    a control current changing circuit for changing a value of said control current in accordance with said set modulation sensitivity and with said set multiplying factor.

6. The phase-locked loop according to claim 5, wherein said control current changing circuit changes said value of said control current in a manner so as to cause an open loop gain in said phase-locked loop to fall within a predetermined range.

7. The phase-locked loop according to claim 5, wherein said charge pump is provided with a plurality of constant current sources to provide constant currents each having a different current value and causes a constant current from a constant current source selected in response to a signal to be fed from said control current changing circuit to flow in or out as said control current.

8. The phase-locked loop according to claim 7, wherein, in said charge pump, a switching circuit for switching between a function of permitting said control current to flow out in accordance with said up-clock and a function of permitting said control current to flow in, in accordance with said down-clock and a receiving/releasing circuit for receiving or releasing said control current are mounted in a separated state.

9. The phase-locked loop according to claim 7, wherein said charge pump is so configured that said plurality of constant current sources are divided into a plurality of blocks each having constant current sources whose constant currents are similar and near to each other and that each block is provided with a selecting circuit for selecting any one of said constant current sources in accordance with a signal to be fed from said control current changing circuit, with said switching circuit for switching between flow-in and flow-out of said control currents and with said receiving/releasing circuit for receiving or releasing said control currents.

10. A phase-locked loop comprising;
    a phase frequency comparator to output an up-clock or down-clock having a pulse width or a number of pulses corresponding to a difference in an oscillation frequency between a reference clock and a frequency-divided clock;

a charge pump to cause a control current to flow in or out in accordance with said up-clock or said down-clock;

a low pass filter to smooth said control current and to output it as a control voltage, a voltage controlled oscillator to oscillate an internal clock having an oscillation frequency corresponding to said control voltage in one oscillation frequency band selected out of a plurality of oscillation frequency bands;

a frequency divider to divide a frequency of said internal clock in accordance with a set multiplying factor and to output it as said frequency-divided clock; and a control current changing circuit for changing a value of said control current in accordance with said set modulation sensitivity and with said set multiplying factor.

11. The phase-locked loop according to claim 10, wherein said control current changing circuit changes said value of said control current in a manner so as to cause an open loop gain in said phase-locked loop to fall within a predetermined range.

12. The phase-locked loop according to claim 10, wherein said charge pump is provided with a plurality of constant current sources to provide constant currents each having a different current value and causes a constant current from a constant current source selected in response to a signal to be fed from said control current changing circuit to flow in or out as said control current.

13. The phase-locked loop according to claim 12, wherein, in said charge pump, a switching circuit for switching between a function of permitting said control current to flow out in accordance with said up-clock and a function of permitting said control current to flow in, in accordance with said down-clock and a receiving/releasing circuit for receiving or releasing said control current are mounted in a separated state.

14. The phase-locked loop according to claim 12, wherein said charge pump is so configured that said plurality of constant current sources are divided into a plurality of blocks each having constant current sources whose constant currents are similar and near to each other and that each block is provided with a selecting circuit for selecting any one of said constant current sources in accordance with a signal to be fed from said control current changing circuit, with said switching circuit for switching between flow-in and flow-out of said control currents and with said receiving/releasing circuit for receiving or releasing said control currents.

15. A semiconductor device being provided with a phase-locked loop comprising:

a phase frequency comparator to output an up-clock or a down-clock having a pulse width or a number of pulses corresponding to a difference in an oscillation frequency between a reference clock and a frequency-divided clock;

a charge pump to cause a control current to flow in or out in accordance with said up-clock or said down-clock;

a low pass filter to smooth said control current and to output it as a control voltage, a voltage controlled oscillator to oscillate an internal clock having an oscillation frequency corresponding to said control voltage in accordance with set modulation sensitivity;

a frequency divider to divide a frequency of said internal clock in accordance with a set multiplying factor and to output it as said frequency-divided clock; and a control current changing circuit for changing a value of said control current in accordance with said set modulation sensitivity and with said set multiplying factor.

16. A semiconductor device being provided with a phase-locked loop comprising:

a phase frequency comparator to output an up-clock or down-clock having a pulse width or a number of pulses corresponding to a difference in an oscillation frequency between a reference clock and a frequency-divided clock;

a charge pump to cause a control current to flow in or out in accordance with said up-clock or said down-clock;

a low pass filter to smooth said control current and to output it as a control voltage, a voltage controlled oscillator to oscillate an internal clock having an oscillation frequency corresponding to said control voltage in one oscillation frequency band selected out of a plurality of oscillation frequency bands;

a frequency divider to divide a frequency of said internal clock in accordance with a set multiplying factor and to output it as said frequency-divided clock; and a control current changing circuit for changing a value of said control current in accordance with said set modulation sensitivity and with said set multiplying factor.

* * * * *